United States Patent [19]

Kim et al.

[11] Patent Number: 5,283,584
[45] Date of Patent: Feb. 1, 1994

[54] HIGH POWER PHOTON TRIGGERED ULTRA-WIDEBAND RF RADIATOR WITH OPPOSITE APERTURES

[75] Inventors: Anderson H. Kim, Toms River; Maurice Weiner, Ocean, both of N.J.; Louis J. Jasper, Jr., Fulton, Md.; Robert J. Youmans, Brick, N.J.

[73] Assignee: The United States of America as represented by the Secrtary of the Army, Washington, D.C.

[21] Appl. No.: 61,614

[22] Filed: May 6, 1993

[51] Int. Cl.⁵ .............................................. H01J 40/14
[52] U.S. Cl. ...................................... 342/21; 250/214.1
[58] Field of Search ................ 342/21, 13; 250/214.1; 307/106

[56] References Cited

U.S. PATENT DOCUMENTS 5,028,971  7/1991  Kim et al.
5,177,486  1/1993  Kim et al. ............................ 342/21
5,227,621  7/1993  Kim et al. ........................ 250/214.1

OTHER PUBLICATIONS

Patent Application Ser. No. 07/946,718, filed Sep. 18, 1992, Kim et al.

*Primary Examiner*—Mark Hellner
*Attorney, Agent, or Firm*—Michael Zelenka; James A. DiGiorgio

[57] ABSTRACT

A photoconductive switch coupled to an energy storage device wherein the switch is comprised of photoconductive semiconductor material while the energy storage device comprises two discrete dielectric mediums. Each medium having a conductive electrode on the top and bottom surfaces to essentially form parallel capacitors wherein the parallel capacitors are separated by a predetermined gap distance. A photoconductive switch electrically connected to each medium such that the switches are located on the opposite sides of their respective mediums. The predetermined gap distance (between the electrodes) and the photoconductive switches (on opposite sides of the storage devices) provide suppression of surface flashover between very high voltage, charged electrodes. Such flashover suppression allowing for very high power pulse generation.

1 Claim, 1 Drawing Sheet

HIGH POWER PHOTON TRIGGERED ULTRA-WIDEBAND RF RADIATOR WITH OPPOSITE APERTURES

GOVERNMENT INTEREST

The invention described herein may be manufactured, used, and licensed by or for the Government of the United States of America for governmental services without the payment to us of any royalty thereon.

FIELD OF THE INVENTION

This invention relates generally to electrical pulse signal generators and more particularly to a nanosecond, kilovolt pulse generator for use in impulse radar apparatus, active electromagnetic signal jammers, and relatively high power microwave weapon systems.

BACKGROUND OF THE INVENTION

In recent years there has been active research in the area of nanosecond-type pulse generation. Such research has produced devices that utilize a high power photoconductive solid state switch coupled to a storage device. In order for such a device to produce a nanosecond-type pulse, the photoconductive switch must have the ability to transition from a high resistivity state to a conductive state in a sub-nanosecond time interval. One such switch, disclosed in U.S. Pat. No. 5,028,971, issued to Anderson H. Kim et al on Jul. 2, 1991, entitled, "High Power Photoconductor Bulk GaAs Switch" is incorporated herein by reference.

This GaAs switch is comprised of two mutually opposite gridded electrodes separated by a GaAs substrate capable of electrical energy storage. The stored energy can be photoconductively discharged when it receives laser light. More specifically, when the laser light is applied to the switch electron-hole pairs are generated in the substrate, thus causing the electrical resistance of the semiconductor material to instantaneously decrease. This resistance change causes the stored energy to instantaneously discharge current through an output circuit. Such instantaneous discharge of current causes an RF pulse to radiate in a direction perpendicular to the substrate.

It is widely recognized that the bandwidth of such RF radiators increases as the width of the radiated RF pulse narrows. Consequently, it has become very desirable for those skilled in the art to construct devices capable of generating faster rise time pulses.

The critical element in generating such fast rise time pulse is the properties of the energy storage device. Heretofore, there are two general techniques used to generate fast rise time, high power pulses. The first technique utilizes the recombination property of the semiconductor material from which the switch itself is fabricated. Pulses generated with this technique, however, typically have a long recovery time at high bias voltage. This long recovery time has been attributed to the substantially long recombination time and the switch lock-on phenomena exhibited by gallium arsenide. A device having such characteristics is not desirable for the many applications that require high power, ultra-wideband pulses.

The second technique utilizes an energy storage element which is comprised of either a short section of transmission line or a capacitor. The energy storage element is photoconductively triggered to instantaneously discharge all or substantially most of its stored energy to an impedance load. As with the aforementioned technique, the extended recovery time inherent in photoconductive switches prevents this device from producing extended wideband radiation.

A major breakthrough in this pulsewidth problem, however, was solved in the inventors copending patent application entitled "Ultra-Wideband High Power Photon Triggered Frequency Independent Radiator," Ser. No. 07/946,718, filed by Kim et al, Sep. 18, 1992 and incorporated herein by reference. This frequency radiator combines an energy storage function and an antenna radiation function into one structure to create an ultra-wideband frequency radiator capable of generating RF pulses with a range of frequency components from hundreds of megahertz to several gigahertz. Basically, this radiator utilizes two identical quasi-radial transmission line structures to store electric energy while it implements photoconductive switching to trigger the instantaneous discharge of the stored energy to generate the desired ultrawideband RF radiation.

Such an energy storage device comprises a dielectric storage medium, two quasi-radially shaped, metalized electrodes mounted opposite one another on the top surface of the dielectric storage medium and a metalized electrode mounted on the bottom surface of the dielectric medium. A photoconductive switch, centrally located on the dielectric between the two quasi-radially shaped electrodes, connects the two quasi-radially shaped electrodes to the bottom electrodes through a load impedance. When the switch is activated by light radiation, the stored energy discharges through the load impedance generating a sub-nanosecond type pulse.

It has been recognized by those skilled in the art that the shape of the electrodes directly affects the radiation bandwidth of the generator, because the shape directly affects the width of the discharged pulse. Specifically, the shape of the electrode directly affects the charging characteristics, and thus the discharging characteristics of the stored energy.

It has also been recognized that the distance (gap) between electrodes directly affects the energy storage capability. The larger the gap between the electrodes, the more energy the device can store before surface flashover and thus device breakdown can occur. If the gap between the electrodes is too wide, however, the bandwidth of the radiated pulse, upon discharge, will be narrowed.

Consequently, those skilled in the art recognize the tradeoff between a radiator having too narrow a gap (which provides for a wider radiation bandwidth, but a greater chance of surface flashover), and a radiator having too wide a gap (which provides a narrower radiation bandwidth, but lesser chance of surface flashover). As such, the need for a GaAs radiator that can provide a higher power pulse without degrading the radiation bandwidth has been recognized.

SUMMARY OF THE INVENTION

Accordingly, the general purpose of this invention is to provide an ultra-wideband high power photon triggered frequency independent radiator with suppressed surface flashover.

This object is achieved by utilizing two separate, discrete, semi-insulating GaAs energy storage substrates having opposing apertures and thus opposing photoconductive switches. Such a device comprises a energy storage device that can be charged to high voltages with minimum surface flashover.

In a preferred embodiment, the device is comprised of a photoconductive switch coupled to an energy storage/pulse radiation device. The energy storage device is comprised of two dielectric storage mediums mounted opposite one another on a dielectric substrate plate. Each storage medium has a metalized conductive plate resting on its top and bottom surface such that they essentially form parallel capacitors. The bottom electrodes on each medium rests on the top surface of the dielectric substrate plate. In addition, each discrete storage device has an aperture located on one of its surface electrodes. The apertures, however, are located on opposite surfaces of the two storage mediums.

The photoconductive switch of each storage medium is activated by shining light on its aperture. Consequently, the discharge of the energy storage device is triggered by shining light on opposite sides of the storage mediums.

The operating sequence of this device is to first charge the parallel capacitors, defined above, by a pulse bias voltage +Vo and −Vo, respectively. Then, to optically activate the photoconductive switches for instantaneous discharge such that a time-varying electromagnetic wave having a broad spectral response is discharged. The pulse essentially propagates perpendicularly from the substrate surface into the open space.

Having opposite apertures allows for an extremely high, differing polarity, field to be supported across the discrete surface electrodes while maintaining charge isolation (no surface flashover during the charging cycle.

BRIEF DESCRIPTION OF THE DRAWINGS

FIG. 1b is a top pictorial view of the dielectric medium of the embodiment in FIG. 1a.

FIG. 1c is a bottom pictorial view of the dielectric medium of the embodiment in FIG. 1a.

DETAILED DESCRIPTION OF THE INVENTION

Figure 1A:
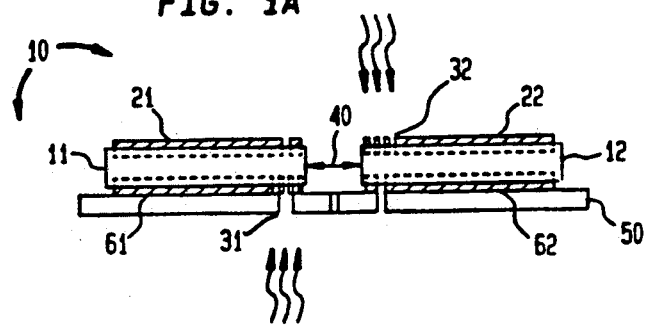
FIG. 1a is a side pictorial view of the preferred embodiment showing the discrete pair of dielectric mediums.

Referring now to the drawings there is shown in FIG. 1a a side view of the preferred embodiment 10. As shown, discrete dielectric mediums 11 and 12 have their bottom surfaces resting on metalized conductive electrodes 61 and 62, respectively, wherein bottom surface electrodes 61 and 62 rest on dielectric plate 50.

The top surface of dielectric mediums 11 and 12 are substantially covered by top surface electrodes 21 and 22, respectively. Aperture 31 on medium 11 is located on the opposite side of aperture 32 on medium 12, wherein mediums 11 and 12 are separated by a gap distance 40. The location of apertures 31 and 32 and their separation by gap distance 40 are the instrumental factors in suppressing surface flashover, and thus device failure. Moreover, these aspects of the device enable it to generate high power pulses without degrading the bandwidth.

Figure 1B:
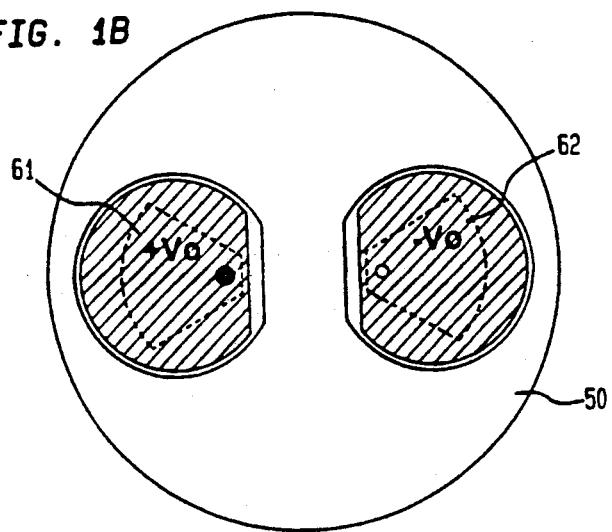
Figure 1C:
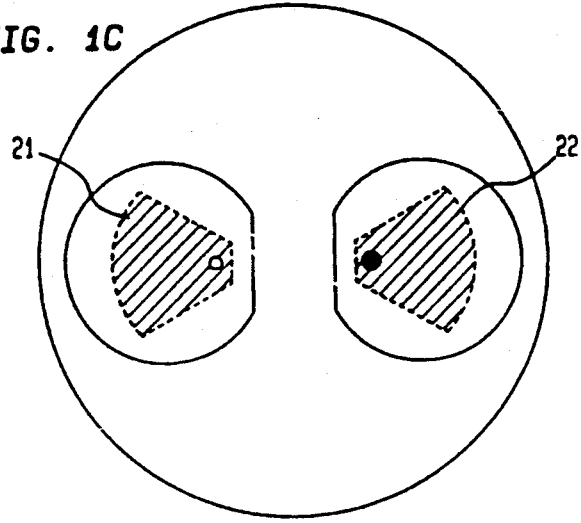

In FIG. 1b, there is shown mediums 11 and 12 having their bottom electrodes 61 and 62 resting on the top surface dielectric plate 50. In FIG. 1c, there is shown the upper surface electrodes 21 and 22. Bottom electrodes 61 and 62 are positioned in relation to top electrodes 11 and 12 such that they essentially form parallel capacitors for energy storage.

What is claimed is:

1. An ultra-wideband high power RF radiator, comprising:

an electrical energy storage device coupled to a source of electrical voltage, said storage device comprised of two dielectric mediums each having an upper and lower surface, said lower surface of each said medium having a metalized electrode resting on a dielectric plate, said upper surfaces of each said medium having a metalized electrode positioned thereon such that said upper and lower surface electrodes essentially form a parallel capacitor for energy storage, said upper surface electrodes separated by a predetermined gap distance that maximizes energy storage voltage and radiation bandwidth; and a photoconductive switch electrically connected to each said dielectric medium but on opposite sides of said dielectric medium surfaces with respect to each other, said switches activated by shining light energy through a predetermined aperture located on the respective surface of each said medium, said activated switch causing said energy storage mediums to discharge a time varying electromagnetic wave comprising a high power, narrow pulse of at least nanosecond pulsewidth dimension.

* * * * *